(12) United States Patent
Pieh

(10) Patent No.: US 8,263,971 B2
(45) Date of Patent: Sep. 11, 2012

(54) ORGANIC LIGHT EMITTING DIODE DISPLAY DEVICE

(75) Inventor: Sung Hoon Pieh, Seoul (KR)

(73) Assignee: LG Display Co., Ltd., Seoul (KR)

(*) Notice: Subject to any disclaimer, the term of this patent is extended or adjusted under 35 U.S.C. 154(b) by 471 days.

(21) Appl. No.: 12/585,002

(22) Filed: Aug. 31, 2009

(65) Prior Publication Data
US 2010/0078631 A1    Apr. 1, 2010

(30) Foreign Application Priority Data
Sep. 30, 2008  (KR) .................. 10-2008-0095967

(51) Int. Cl.
H01L 29/08 (2006.01)
H01L 35/24 (2006.01)
H01L 51/00 (2006.01)

(52) U.S. Cl. ............ 257/40; 257/440; 257/E51.001; 257/E51.018; 257/E51.022; 257/E51.026; 257/E33.054; 257/E33.061; 257/E31.096; 257/E31.129; 438/28; 438/29; 438/34; 438/35; 438/69; 438/74; 438/82; 438/99; 313/483; 313/504; 313/507; 313/463; 345/36; 345/45; 345/47; 345/76; 250/483.1; 250/486.1; 136/243; 136/247; 136/257; 136/263

(58) Field of Classification Search .......... 257/40, 257/440, E51.001, E51.018, E51.022, E51.026, 257/E33.054, E33.061, E31.096, E31.129; 438/28, 29, 34, 35, 69, 74, 82, 99; 313/483, 313/504, 507, 463; 345/36, 45, 47, 76; 250/483.1, 250/486.1; 136/243, 247, 257, 263
See application file for complete search history.

(56) References Cited

U.S. PATENT DOCUMENTS
2008/0224602 A1* 9/2008 Choi et al. .......... 313/504
2008/0297036 A1* 12/2008 Noh et al. .......... 313/504

FOREIGN PATENT DOCUMENTS
CN 1729724 A 2/2006
CN 101213683 A 7/2008
CN 101222023 A 7/2008
* cited by examiner Primary Examiner — Meiya Li
(74) Attorney, Agent, or Firm — McKenna Long & Aldridge, LLP

(57) ABSTRACT

The OLED display device includes a first stack and a second stack that are separated from each other between an anode electrode and a cathode electrode, with a charge generation layer sandwiched between the first stack and the second stack, each of the first stack and the second stack having an emission layer. The first stack includes a blue emission layer formed between the anode electrode and the CGL. The second stack includes a fluorescent green emission layer and a phosphorescent red emission layer formed between the cathode electrode and the CGL. The blue emission layer includes one of a fluorescent blue emission layer and a phosphorescent blue emission layer.

3 Claims, 8 Drawing Sheets

Blue Host

AND
9,10-di(2-naphthyl)anthracene

DPVBi
4,4'-bis(2,2-diphenylethen-1-yl)-diphenyl

Blue Dopant

1,6-Bis(diphenylamine)pyrene

TBPe
tetrakis(t-butyl)perylene

FIG. 3

Green Host

ADN
9,10-di(2-naphthyl)anthracene

Green Dopant

C545T
(10-(2-benzothiazolyl)-1,1,7,7
-tetramethyl-2,3,6,7-tetrahydro
-1H,5H,11H-[l]benzo-pyrano[6,7,8-ij]
9,10-di(2-naphthyl)anthracene

FIG. 4

Phosphorescent Red Host

CBP
4,4'-N,N'-dicarbazolebiphenyl

Phosphorescent Red Dopant (Btp2Ir(acac)
bis(2-(20-benzo[4,5-a]thienyl)
pyridinato-N,C30)iridium
(acetylactonate)

Btp2Ir(acac)
iridium(III)bis(1-phenylisoquinolyl)-N,
C2') acetylacetonate

|  | R ∥ B/G | | | | G ∥ B/R | | | | B ∥ R/G | | | |
|---|---|---|---|---|---|---|---|---|---|---|---|---|
|  | B | G | R | W | B | G | R | W | B | G | R | W |
| Cd/A | 2.5 | 13.6 | 16.9 | 33 | 2.5 | 27.1 | 8.4 | 38 | 5 | 13.6 | 8.4 | 27 |
| x | 0.140 | 0.286 | 0.652 | 0.444 | 0.140 | 0.286 | 0.652 | 0.349 | 0.140 | 0.286 | 0.652 | 0.312 |
| y | 0.110 | 0.658 | 0.345 | 0.357 | 0.110 | 0.658 | 0.345 | 0.430 | 0.110 | 0.658 | 0.345 | 0.299 |

| | R ∥ B/G | | | | G ∥ B/R | | | | B ∥ R/G | | | |
|---|---|---|---|---|---|---|---|---|---|---|---|---|
| | B | G | R | Color reproduction range (%) | B | G | R | Color reproduction range (%) | B | G | R | Color reproduction range (%) |
| Cd/A | 1.654 | 12.319 | 12.035 | 68.0 (xy) 71.9 (u'v') | 2.426 | 19.627 | 6.936 | 76.9 (xy) 65.5 (u'v') | 2.389 | 12.187 | 6.359 | 78.4 (xy) 86.2 (u'v') |
| x | 0.141 | 0.328 | 0.670 | | 0.134 | 0.266 | 0.663 | | 0.138 | 0.265 | 0.665 | |
| y | 0.113 | 0.597 | 0.329 | | 0.154 | 0.659 | 0.334 | | 0.087 | 0.616 | 0.330 | |
| Power (W) | 212.3 | | | | 197.6 | | | | 144.5 | | | |

ORGANIC LIGHT EMITTING DIODE DISPLAY DEVICE

This application claims the benefit of Korea patent application no. 10-2008-0095967 filed on Sep. 30, 2008, which is incorporated herein by reference for all purposes as if fully set forth herein.

BACKGROUND

1. Field of the Invention

This disclosure is directed to an organic light emitting diode display device that can increase color stability and assure a long life span.

2. Discussion of the Related Art

Recently, various types of flat display devices have been developed to reduce weight and volume which is a shortcoming of cathode ray tubes. These flat display devices include liquid crystal displays (LCDs), field emission displays (FEDs), plasma display panels (PDPs), and electroluminescence devices (ELs).

An organic light emitting diode (hereinafter, referred to as "OLED") or electroluminescent device (EL) may include an anode electrode, a cathode electrode, and an organic light emitting material layer interposed between the anode electrode and the cathode electrode, wherein the anode electrode is typically made of a transparent conductive material such as ITO (Indium Tin Oxide), and the cathode electrode is typically made of a metal with a low work function such as Mg, Ca, Al, or an alloy thereof, In an OLED, positive charges (holes) and negative charges (electrons) are inserted into from the anode electrode and the cathode electrode, respectively, to the light emitting material layer, and recombined in the light emitting material layer thereby to form an excited state that may emit light.

An organic light emitting diode device has been developing in various structures. Among them, a white OLED generally has a red light emitting layer, a green light emitting layer, and a blue light emitting layer stacked. However, such a stack-structured white OLED has problems of short life span of the blue light emitting layer, low color stability caused by the short life span, and relatively high driving voltage. To overcome these problems, the number of layers may increase and the structure may be complicated, thus causing lowering in mass production.

SUMMARY

An aspect of this document is to provide an OLED display device and a method of producing the OLED display device that can raise color stability and assure high efficiency and long life span.

In an aspect, an organic light emitting diode display device includes a first stack and a second stack that are separated from each other between an anode electrode and a cathode electrode, with a charge generation layer (CGL) sandwiched between the first stack and the second stack, each of the first stack and the second stack including an emission layer.

The first stack includes a blue emission layer formed between the anode electrode and the CGL, and the second stack includes a fluorescent green emission layer and a phosphorescent red emission layer formed between the cathode electrode and the CGL.

The blue emission layer may include one of a fluorescent blue emission layer and a phosphorescent blue emission layer.

In another aspect, there is an organic light emitting diode display device, wherein the first stack includes a fluorescent blue emission layer formed between the anode electrode and the CGL, and the second stack includes a fluorescent green emission layer and a phosphorescent red emission layer formed between the cathode electrode and the CGL.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Hereinafter, exemplary embodiments will be described with reference to FIGS. 1 to 11.

Figure 1:
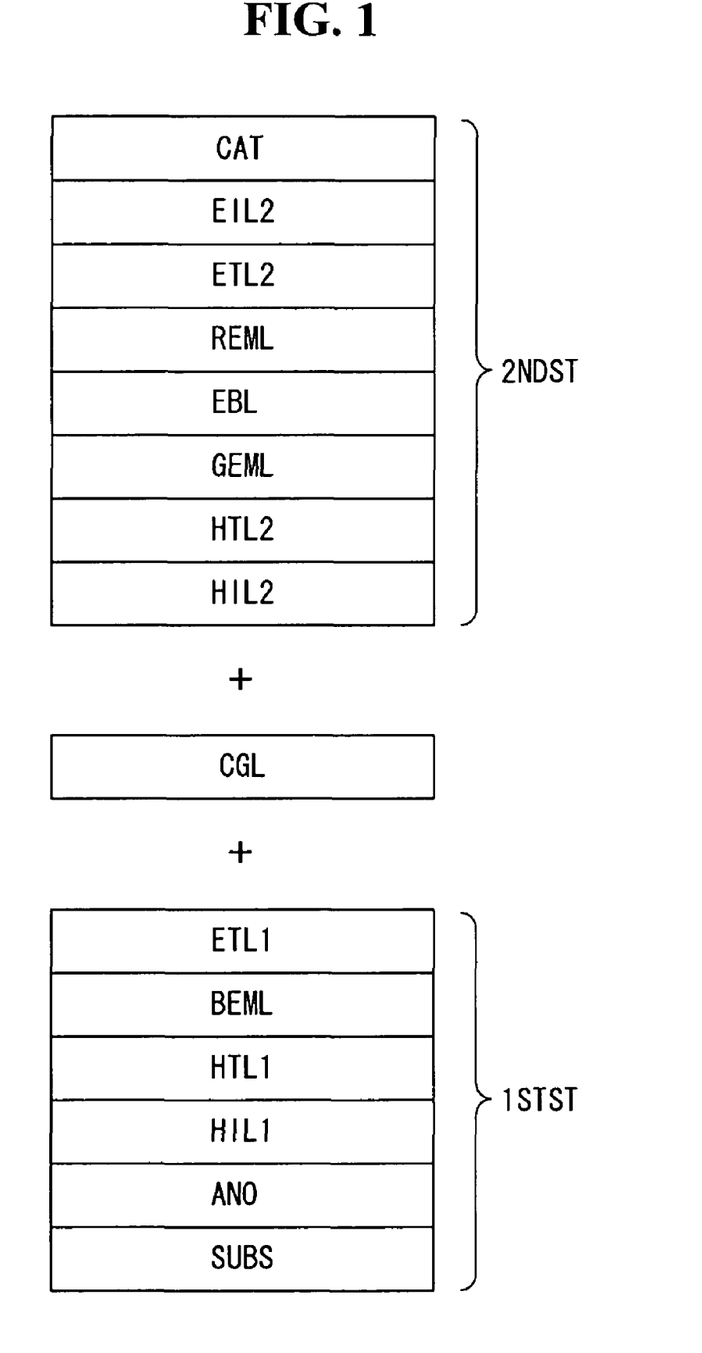
FIG. 1 is a view illustrating a structure of an OLED according to an exemplary embodiment.

Referring to FIG. 1, an OLED display device according to a first exemplary embodiment includes a white OLED that emits white light including red, green, and blue wavelengths.

This white OLED has a structure that has a cathode electrode CAT, an anode electrode ANO, and first and second stacks between the cathode electrode and the anode electrode ANO. The first stack 1STST emits a blue wavelength of fluorescent light. The second stack 2NDST is stacked on the first 1STST to emit a green wavelength of fluorescent light, and a red wavelength of phosphorescent light.

Figure 2:
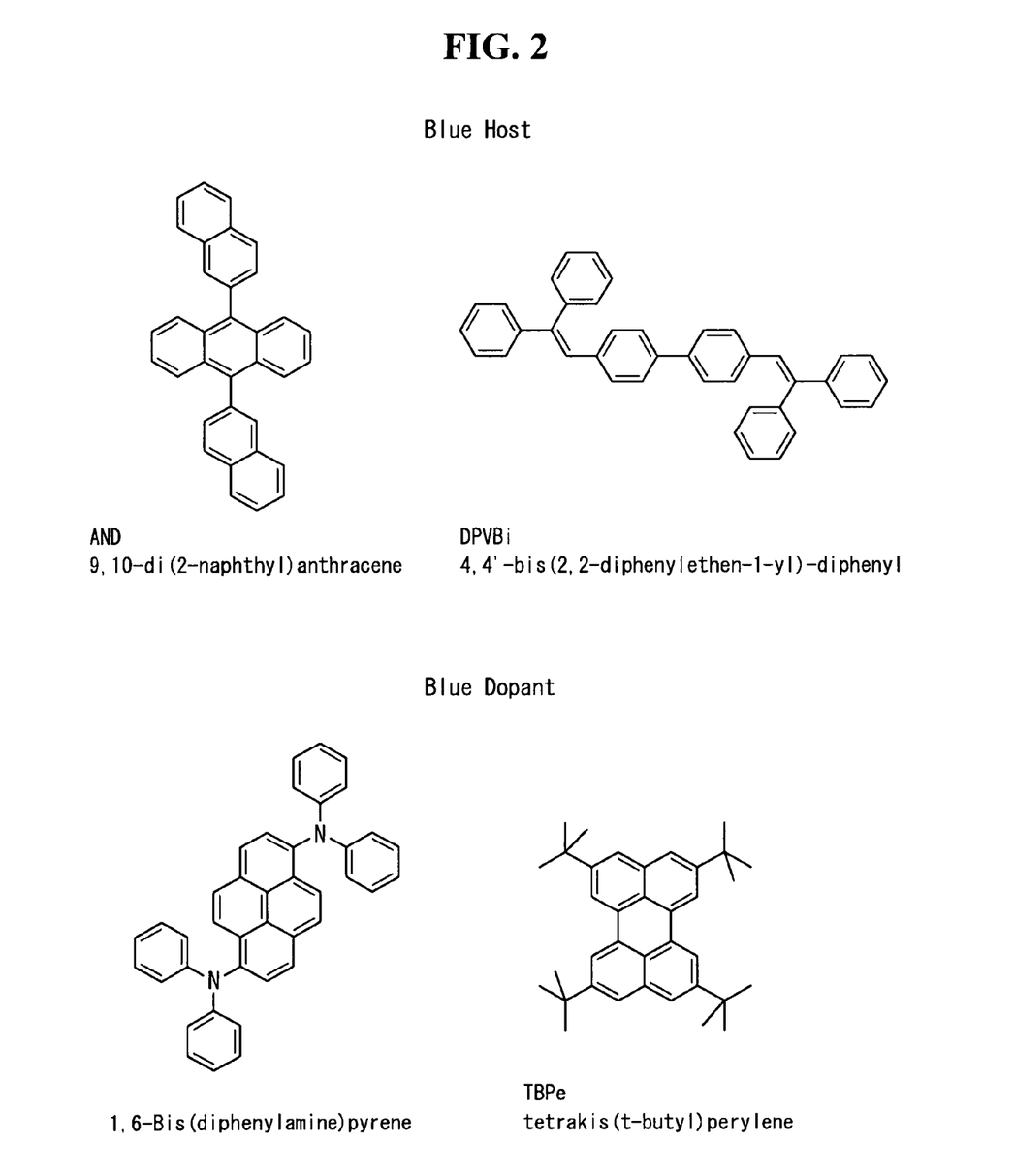
FIG. 2 is a view illustrating an exemplary material for the blue light emitting layer shown in FIG. 1.

A charge generation layer (CGL) is formed between the first and second stacks 1STST and 2NDST. The CGL is a material having low optical, electrical loss properties, and may include, for example, metals, oxides, organisms, or stacks thereof The first 1STST includes an anode electrode ANO stacked on a substrate SUBS, a first hole injection layer HIL1, a hole transport layer HTL1, a blue emission layer BEML, and a first electron transport layer ETL1. The blue emission layer BEML may include a fluorescent or phosphorescent blue emission layer BEML. Since the first 1STST includes the blue emission layer BEML alone as the light emission layer and thus only emits blue light, life span may be extended and color stability may be raised. The blue emission layer BEML may be formed of a known blue fluorescent light emitting material or blue phosphorescent light emitting material. As an example, the blue emission layer BEML may be a light emitting material obtained by adding a blue dopant such as 1,6-Bis(diphenylamine)pyrene, TBPe tetrakis(t-butyl)perylene to a host material such as AND 9,10-di(2-naphthyl)anthracene or DPVBi 4,4'-bis(2,2-diphenylethen-1-yl)-diphenyl as shown in FIG. 2. The blue emission layer BEML is not limited thereto but may include a host material containing CBP or mCP and include a fluorescent dopant such as DSA (distyrylarylene).

As seen from the experimental results, when the fluorescent blue light emitting layer is used for the blue emission layer BEML applied to the first 1STST instead of the phosphorescent blue light emitting layer, efficiency, power consumption, and color stability might be improved.

The second stack 2NDST includes a second hole injection layer HIL2, a second hole transport layer HTL2, a fluorescent green emission layer GEML, an exciton blocking layer EBL, a phosphorescent red emission layer REML, a second electron transport layer ETL2, and an electron injection layer EIL that are stacked on the CGL.

The exciton blocking layer EBL is formed in one or more inorganic layer, one or more organic layer, or a stacked layer thereof to adjust singlet excited state energy and triplet excited state energy between a fluorescent green emission layer (GEML) and a phosphorescent red emission layer (REML). The exciton blocking layer EBL may include any known EBL materials.

The second stack 2NDST may obtain 100% of internal quantum efficiency by using a hybrid structure stacked by a phosphorescent red emission layer REML and a fluorescent green emission layer GEML.

Figure 3:
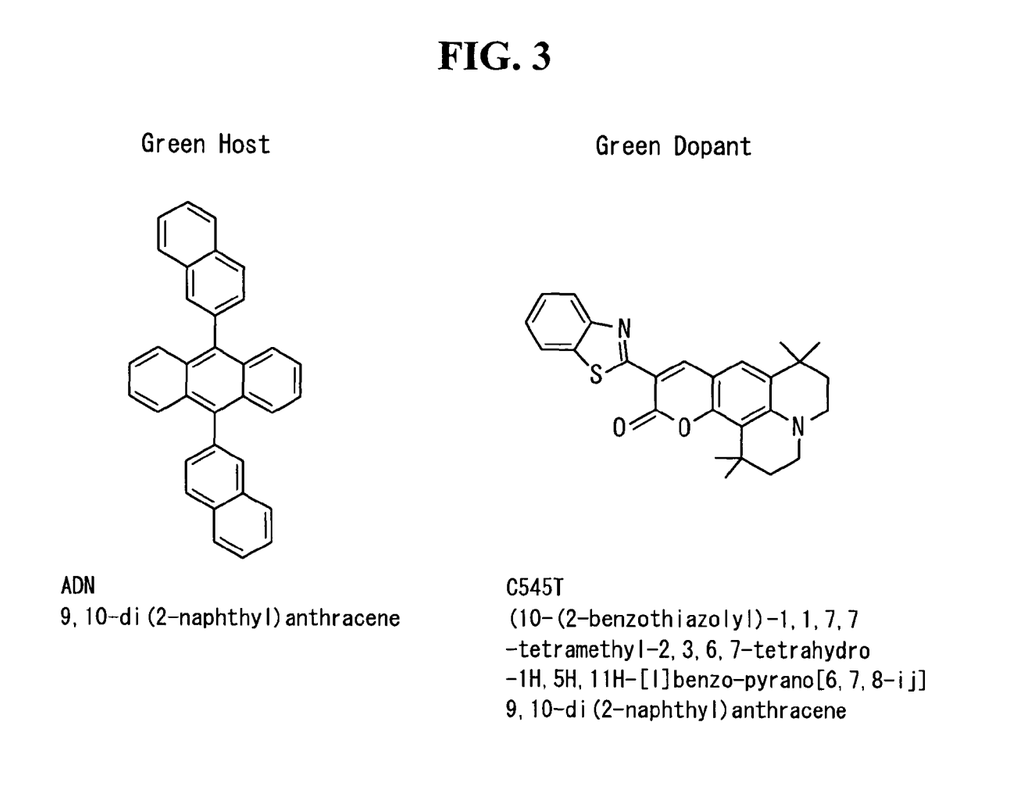
FIG. 3 is a view illustrating an exemplary material for the green light emitting layer shown in FIG. 1.

The fluorescent green emission layer GEML may include any known fluorescent green light emitting layer materials, for example, obtained by adding a fluorescent green dopant such as C545T (10-(2-benzothiazolyl)-1,1,7,7-tetramethyl-2,3,6,7-tetrahydro-1H,5H,11H-[1]benzo-pyrano[6,7,8-ij] quinolizin-11-one to a host material such as ADN 9,10-di(2-naphthyl)anthracene as shown in FIG. 3. The fluorescent green emission layer GEML is not limited thereto, but may include a host material containing CBP or mCP.

Figure 4:
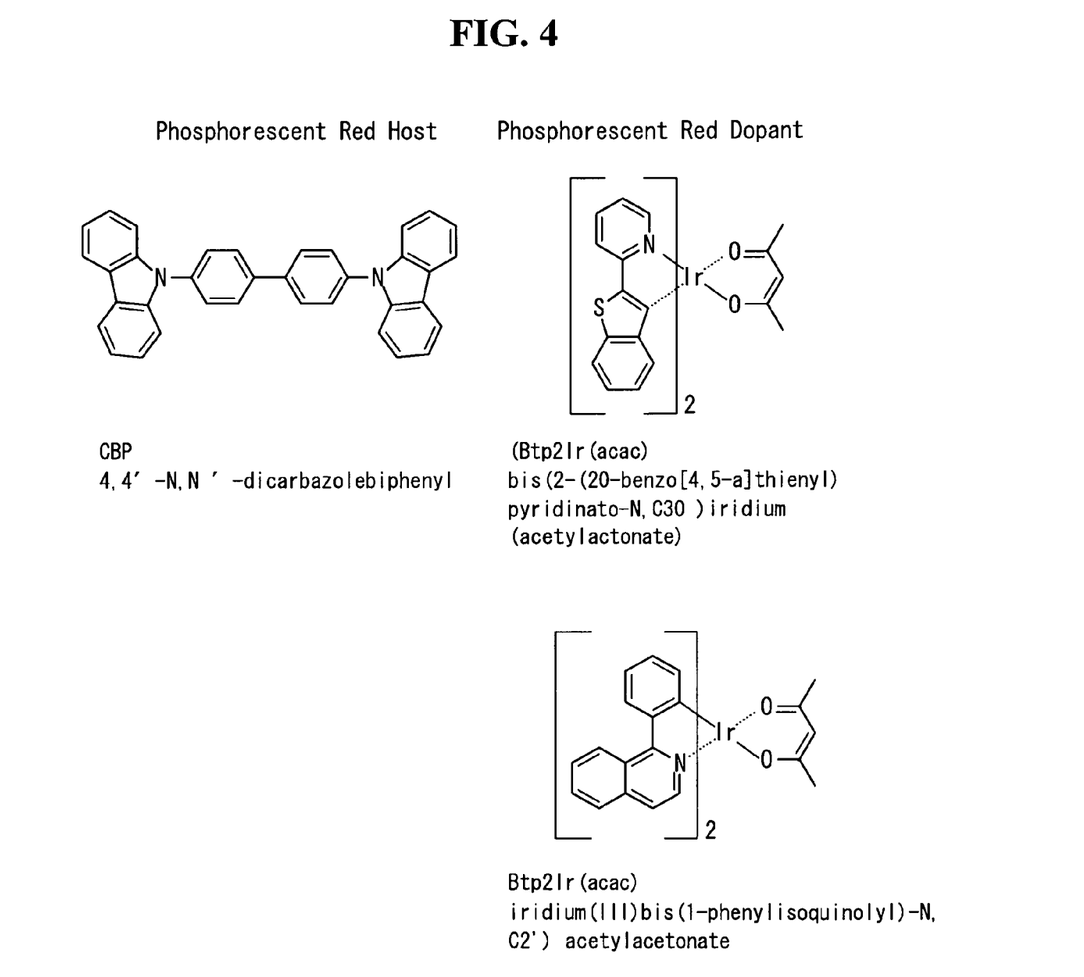
FIG. 4 is a view illustrating an exemplary material for the red light emitting layer shown in FIG. 1.

The phosphorescent red emission layer REML may include any known phosphorescent red light emitting layer materials, for example, obtained by adding a phosphorescent red dopant such as (Btp2Ir(acac)) bis(2-(20-benzo[4,5-a] thienyl)pyridinato-N,C30)iridium(acetylactonate), Btp2Ir (acac) iridium(III)bis(1-phenylisoquinolyl)-N,C2') acetylacetonate to a host material such as CBP 4,4'-N,N'-dicarbazolebiphenyl as shown in FIG. 4. The phosphorescent red emission layer REML may include a host material containing CBP(carbazole biphenyl) or mCP(1,3-bis(carbazol-9-yl), and may include any one or more phosphorescent red dopant selected from PIQIr(acac)(bis(1-phenylisoquinoline) acetylacetonate iridium), PQIr(acac)(bis(1-phenylquinoline) acetylacetonate iridium), PQIr(tris(1-phenylquinoline)iridium), PtOEP(octaethylporphyrin platinum).

In FIG. 1, the hole injection layers HIL1 and HIL2 smoothen the injection of holes, and may include, but not limited to, any one or more material selected from CuPc (cupper phthalocyanine), PEDOT(poly(3,4)-ethylenedioxythiophene), PANI(polyaniline), NPD(N,N-dinaphthyl-N, N'-diphenyl benzidine). The hole transport layers HTL1 and HTL2 smoothen transport of holes and may include, but limited to, any one or more material selected from NPD(N, N-dinaphthyl-N,N'-diphenyl benzidine), TPD(N,N'-bis-(3-methylphenyl)-N,N'-bis-(phenyl)-benzidine), s-TAD, MTDATA(4,4',4"-Tris(N-3-methylphenyl-N-phenyl-amino)-triphenylamine). The electron transport layers ETL1 and ETL2 smoothen transport of electrons and may include, but not limited to, any one or more material selected from Alq3(tris(8-hydroxyquinolino)aluminum), PBD, TAZ, Spiro-PBD, BAlq, SAlq. The electron injection layer EIL2 smoothens injection of electrons and may include, but limited to, any one or more material selected from Alq3(tris(8-hydroxyquinolino)aluminum), PBD, TAZ, spiro-PBD, BAlq, SAlq.

The OLED according to the exemplary embodiment uses light emission through fluorescence and phosphorescence. The phosphorescence means light emission from a triplet excited state. In comparison, the fluorescence means light emission from a singlet excited state. Accordingly, OLED luminescence means either fluorescent light emission or phosphorescence light emission.

All excitons, which are created through one of a singlet excited state and triplet excited state by recombination of holes and electrons, may participate in light emission for phosphorescence. This is why the lowest singlet excited state of organic molecules is under an energy state slightly higher than that of the lowest triplet excited state. In phosphorescent organic metal compounds, for example, the lowest singlet excited state may swiftly collapse to the lowest triplet excited state in which phosphorescence may be generated. In contrast, only about 25% of excitons in a fluorescent element may create a fluorescent light emission that may be acquired from a singlet excited state. In the fluorescent element, the remaining excitons generated in the lowest triplet excited state may not transform to a singlet excited state having higher energy of being capable of creating fluorescence.

Figure 5:
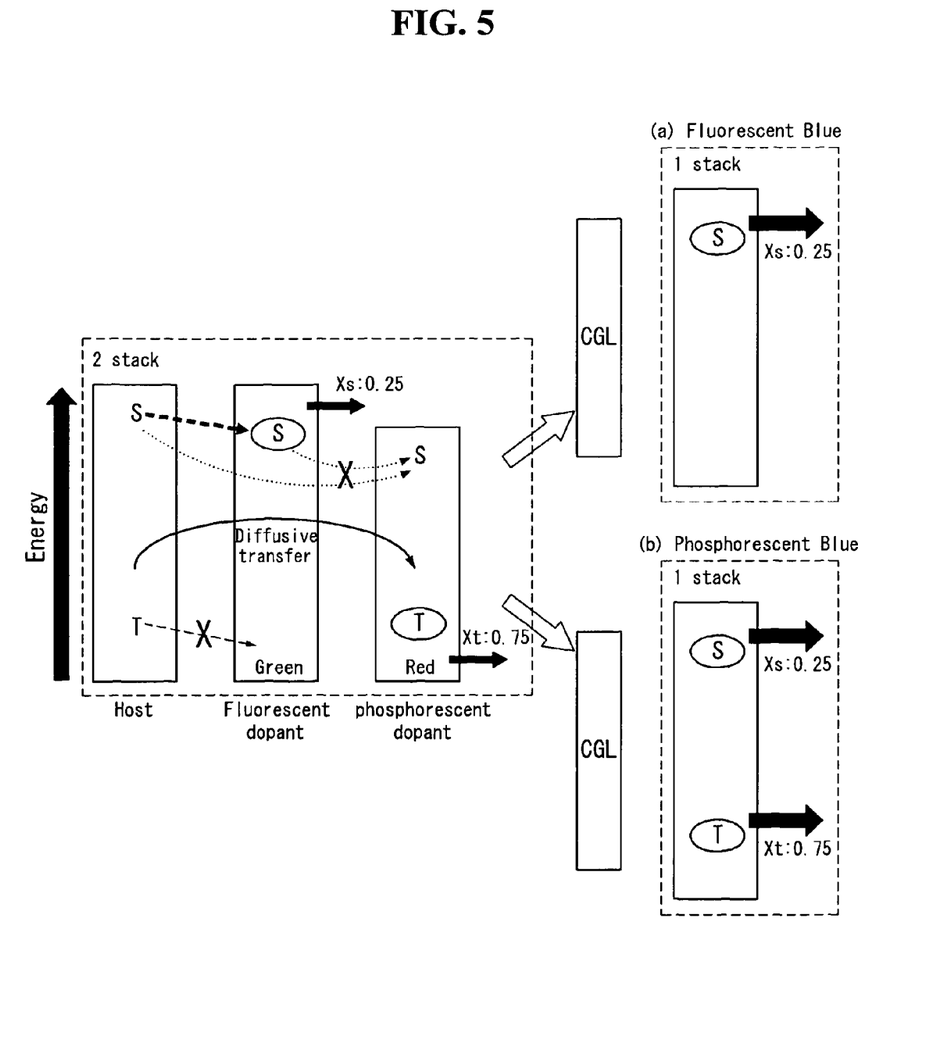
FIG. 5 is a view illustrating an energy transfer mechanism of the OLED shown in FIG. 1.

An energy transfer mechanism of the OLED as shown in FIG. 1 will be described with reference to FIG. 5 on the basis of the above principle of fluorescence and phosphorescence.

The fluorescent green emission layer GEML fluorescently emits light by about 25% of excitons Xs:0.25 generated by a singlet excited state from the host material in the second stack 2NDST. And, the phosphorescent red emission layer REML phosphorescently emits light by about 75% excitons Xt:0.75 generated by a triplet excited state from the host material transferred via the fluorescent green emission layer GEML.

The blue emission layer BEML may be formed of fluorescent light emitting material or phosphorescent light emitting material in the first 1STST. When the blue emission layer BEML is formed of the fluorescent blue emission layer, the blue emission layer BEML fluorescently emits light from a singlet excited state by about 25% excitons. When the blue emission layer BEML is formed of the phosphorescent blue emission layer, the blue emission layer BEML fluorescently emits light from a singlet excited state by about 25% excitons and phosphorescently emits light from a triplet excited state by about 75% excitons.

The OLED display device according to an exemplary embodiment may be produced in a bottom emission structure or top emission structure that includes the OLED as shown in FIG. 1.

Figure 6:
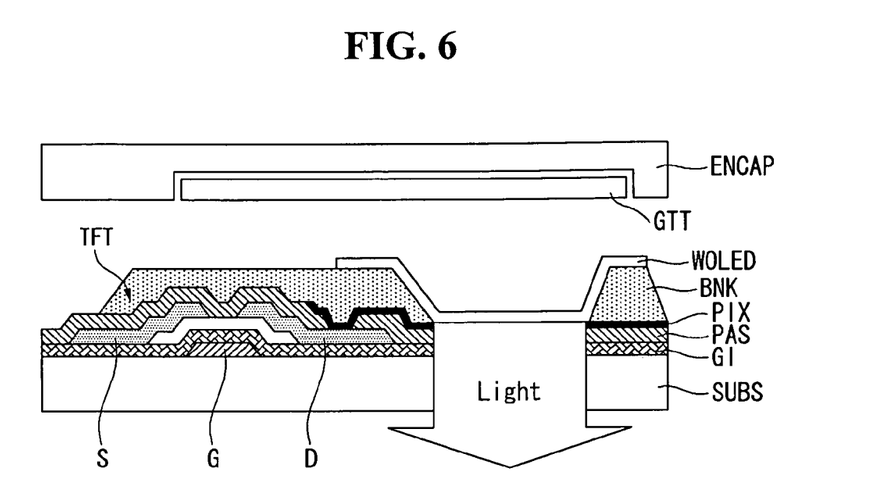
FIG. 6 is a view illustrating a bottom emission structure OLED display device according to a first exemplary embodiment.

FIG. 6 depicts a bottom emission structure OLED display device according to a first exemplary embodiment.

Referring to FIG. 6, a TFT is formed on a transparent substrate SUBS and a pixel electrode PIX is connected to the TFT. The pixel electrode PIX is connected to the drain electrode D of the TFT and the anode electrode ANO of the white OLED WOLED shown in FIG. 1. In FIG. 6, the reference character "GI" refers to a gate insulating film that insulates a gate metal pattern including the gate electrode G of the TFT and a gate line connected to the gate electrode G from a source/drain metal pattern including the source and drain electrodes S and D of the TFT and a data line. "PAS" refers to a passivation layer for protecting the TFT and a contact hole is formed in the passivation layer to allow the pixel electrode PIX to contact the drain electrode D of the TFT. "BNK" refers to a structure for partitioning a red pixel, a green pixel, and a blue pixel. "ENCAP" refers to an encapsulation member that includes a getter GTT and is attached to the transparent substrate SUBS by sealant. The white OLED WOLED has such a double-layer stacking structure as shown in FIG. 1 and light emitted from the white OLED passes through the passivation layer PAS, the gate insulating film GI, the anode electrode ANO, and the transparent substrate SUBS.

A red color filter, a green color filter, and a blue color filter may be formed between the transparent substrate SUBS and the white OLED to realize color.

Figure 7:
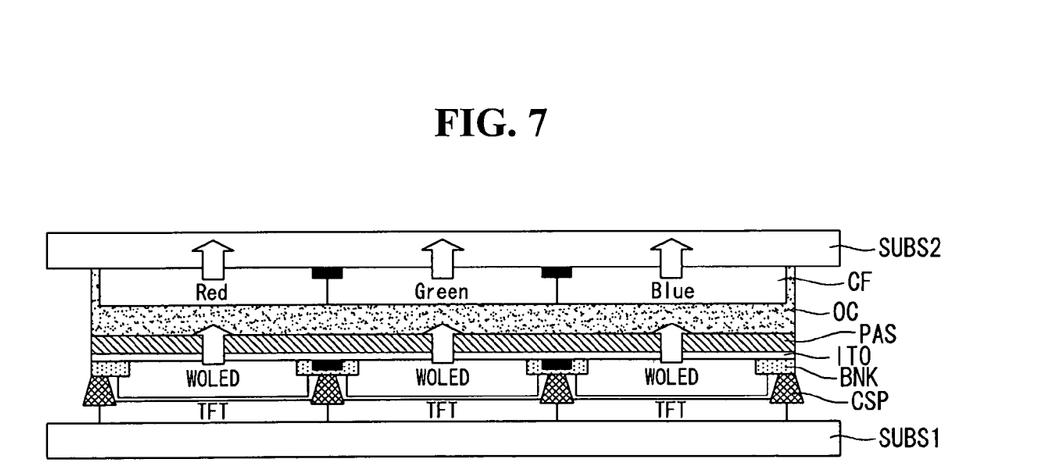
FIG. 7 is a view illustrating a top emission structure OLED display device according to a second exemplary embodiment.

FIG. 7 is a top emission structure OLED display device according to a second exemplary embodiment.

Referring to FIG. 7, a TFT array is formed on a lower substrate SUBS1. A passive OLED array including the white OLED WOLED as shown in FIG. 1 is formed on an upper substrate SUBS2. Red, green, and blue color filters CF are formed on the upper substrate SUBS2 to implement color, and a transparent overcoat layer OC and a passivation layer PAS are formed on the color filters CF. And, a bank pattern BNK and a conductive column spacer CSP are formed on the upper substrate SUBS2. The conductive column spacer allows the drain electrode or source electrode of the TFT to be electrically connected to the anode electrode or cathode electrode of the white OLED. The white OLED has such a double-stack structure as shown in FIG. 1, and light emitted from the white OLED passes through the passivation layer PAS, the overcoat layer OC, the color filter CF, and the transparent substrate SUBS2.

The OLED display device according to the exemplary embodiment is not limited to the structure as shown in FIGS. 6 and 7, but may include any types of structures such as a bottom emission structure, a top emission structure, a bidirectional emission structure that includes the white OLED as shown in FIG. 1.

Figure 9:
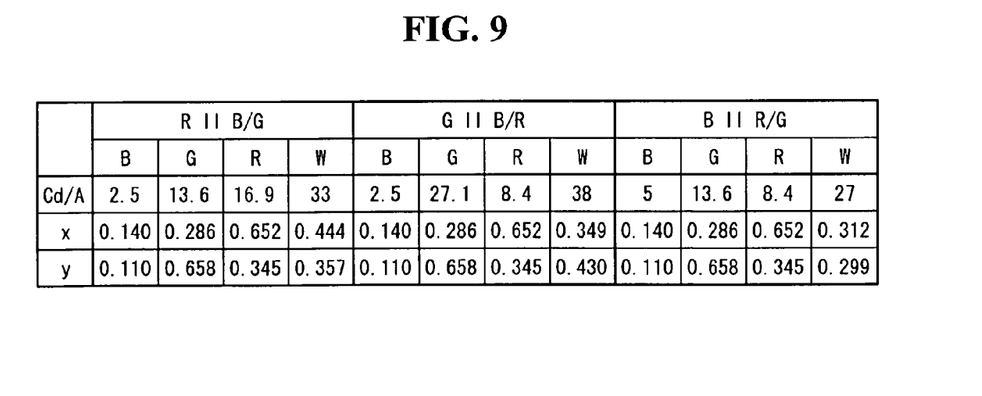
FIG. 9 is a view illustrating experimental results including efficiency and color coordinates of a white OLED according to an exemplary embodiment and other comparative white OLEDs (R☐B/G, G☐B/R).
Figure 10:
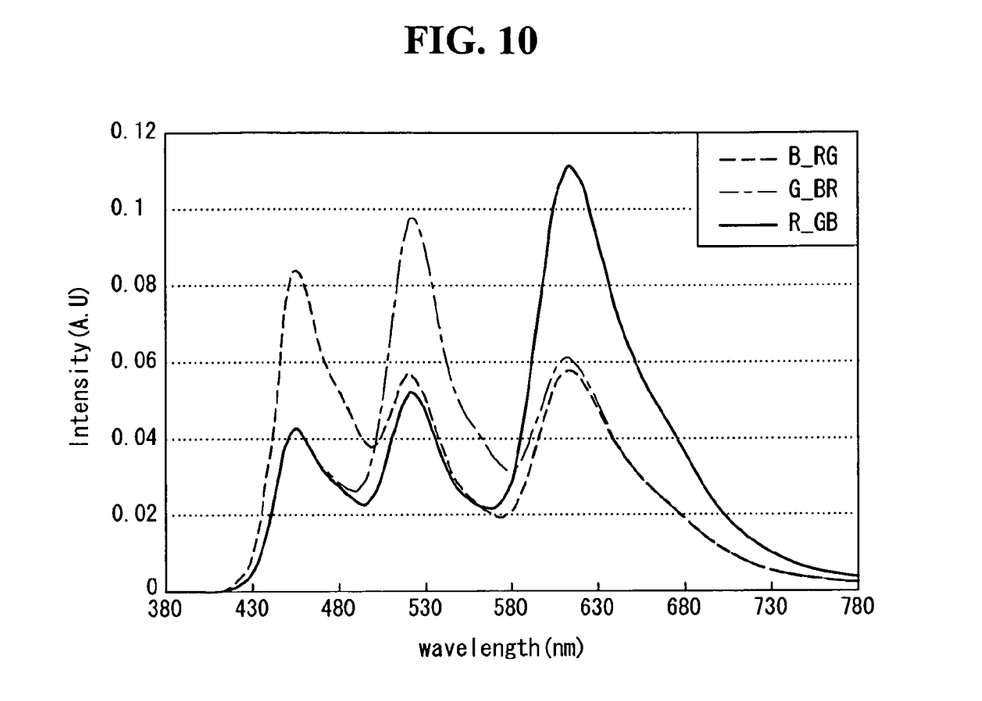
FIG. 10 is a graph illustrating light intensity for each and every wavelength of the white OLEDs applied to the experiment of FIG. 9.
Figure 11:
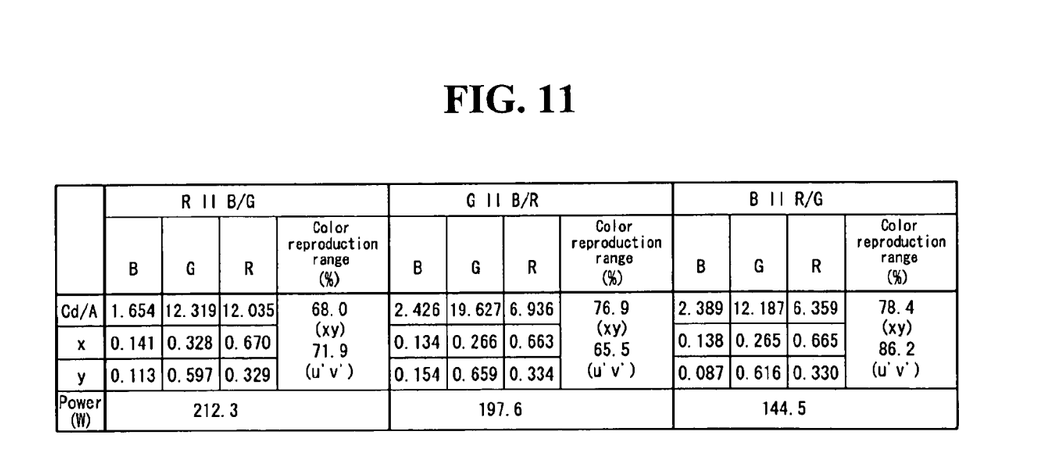
FIG. 11 is a view illustrating efficiencies, color reproduction ranges, and consumption power for practically applicable panels obtained by combining a color filter with the white OLEDs applied to the experiment of FIG. 9.

FIGS. 9 to 11 are views illustrating experimental results for comparing a white OLED according to an exemplary embodiment with the other white OLEDs having the different stacking structure from that of the white OLED according to the exemplary embodiment to evaluate efficiency, color stability, and power consumption of the white OLED according to the exemplary embodiment.

Figure 8:
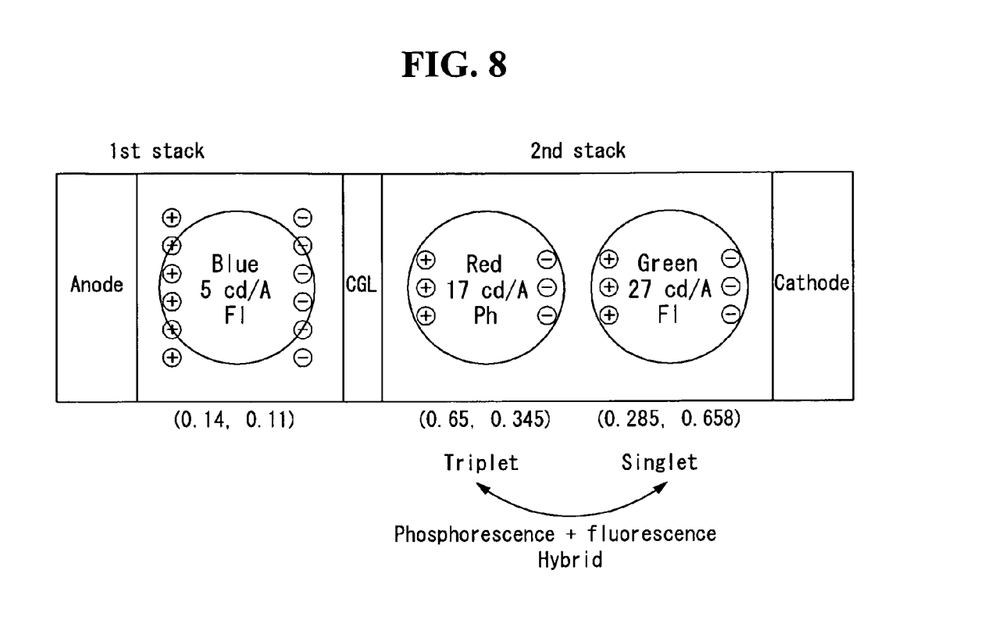
FIG. 8 is a view illustrating a structure of a white OLED applied to an experiment according to an exemplary embodiment.

The white OLED according to the exemplary embodiment applied to this experiment includes a first stack 1STST independently containing a fluorescent blue emission layer and a second stack 2NST separated from the first 1STST with the CGL sandwiched therebetween, the second stack 2NST including hybrid light emission layers of phosphorescent red light emission layers and fluorescent green light emission layers as shown in FIG. 8. In the drawings, "Fl" refers to a fluorescent material and "Ph" refers to a phosphorescent material. A numeral below the light emission layer refers to a color coordinate (x, y) of light emitted from each light emission layer.

In the OLED according to the exemplary embodiment as shown in FIG. 8, theoretical values of red, green, and blue efficiencies in a color coordinate of 0.312(x) and 0.298(y) are as follows:

5 cd/A(blue efficiency)+13.5 cd/A(green efficiency)+ 8.5 cd/A(red efficiency)=27 cd/A.

The below theoretical values 1 and 2 are equal to an OLED efficiency of FIG. 8, which is calculated from the below equation 1 in consideration of χtrap (ratio by which excitons are directly trapped by the phosphorescent dopant), 1-χtrap (ratio by which excitons are created at edges of the emission layers), and triplet (ratio of those under a triplet excited state among excitons)

$$\eta ext=(1-\chi trap)\eta Fl+[(1-\chi trap)\chi triplet+\chi trap]\eta Ph \quad \text{[Equation 1]}$$

Here, "ηext", "ηFl", and "ηPh" refer to efficiencies by which electrons externally applied are transformed to light with an external quantum efficiency (EQE). "ηFl" refers to EQE in fluorescence, and "ηPh" refers to EQE in phosphorescence. Accordingly, "ηext" is identical to the EQE value for the entire OLED display devices that is yielded from the result calculated in Equation 1.

(1) Theoretical value 1 (χtrap=0.18, χtriplet=0.75)

Efficiency of the second stack (2NDST)=(1−0.18)×27 cd/A+((1−0.18)−0.75+0.18)×17 cd/A=35.7 cd/A.

Accordingly, the total OLED efficiency at color coordinate (0.35, 0.34)=5 cd/A(efficiency of the first stack)+35.7 cd/A=40.7 cd/A.

(2) Theoretical value 1 (χtrap=0.0, χtriplet=0.75)

Efficiency of the second stack (2NDST)=27 cd/A+0.75×17 cd/A=39.8 cd/A.

Accordingly, the total OLED efficiency at color coordinate (0.34, 0.362)=5 cd/A+39.8 cd/A=44.8 cd/A.

Referring to FIG. 9, the white OLED according to the exemplary embodiment, where a fluorescent blue emission layer is formed on the first 1STST and a phosphorescent red emission layer and a fluorescent green emission layer are formed on the second stack 2NDST, exhibited higher efficiency in blue by 5 Cd/A and a more enhanced color temperature than the comparative white OLEDs (R☐B/G, G☐B/R). Here, the comparative white OLEDs of the white OLED according to the exemplary embodiment have a red emission layer at the first stack and blue and green emission layers at the second stack. The white OLED of G☐B/R structure has a green emission layer at the first stack and blue and red emission layers at the second stack. FIG. 10 is a graph illustrating distributions in light intensity for each of a white OLED having a R☐B/G structure and a white OLED having a G☐B/R structure compared by the white OLED (B_RG) according to an exemplary embodiment.

As can be seen from the experimental results shown in FIG. 9, when a red emission layer or a green emission layer are formed at the first stack 1STST separated from the second stack 2NDST like the comparative white OLEDs (R☐B/G, G☐B/R) of the white OLED according to the exemplary embodiment, the efficiency of white light is raised. An experimental result using an actually applicable panel obtained by combining the comparative white OLEDs (R☐B/G, G☐B/R) with a color filter showed lowered color reproduction range and increased power consumption compared to the white OLED according to the exemplary embodiment as shown in FIG. 11 after passing through the color filter. Consequently, it can be seen that most excellent color stability and power consumption have been shown when the blue emission layer BEML alone is independently arranged at the first 1STST to be separated from the second stack 2NDST and the fluorescent green emission layer GEML and the phosphorescent red emission layer REML are arranged at the second stack 2NDST in a hybrid structure.

As described above, the OLED display device according to the exemplary embodiments can raise color stability, assure high efficiency and long life span, as well as may reduce power consumption by independently arranging the blue emission layer BEML alone at the first 1STST to be separated from the second stack 2NDST and stacking the fluorescent green emission layer GEML and the phosphorescent red emission layer REML at the second stack 2NDST in a hybrid structure.

Embodiments of the invention being thus described, it will be obvious that the same may be varied in many ways. Such variations are not to be regarded as a departure from the scope of the invention, and all such modifications as would be obvious to one skilled in the art are intended to be included within the scope of the following claims.

What is claimed is:

1. An organic light emitting diode display device comprising:
    a first stack and a second stack that are separated from each other between an anode electrode and a cathode electrode, with a charge generation layer (CGL) sandwiched between the first stack and the second stack, each of the first stack and the second stack including at least one emission layer,
    wherein the emission layer of the first stack includes only a fluorescent blue emission layer formed between the anode electrode and the CGL, and the emission layer of the second stack includes a fluorescent green emission layer and a phosphorescent red emission layer stacked in a hybrid structure between the cathode electrode and the CGL.

2. The organic light emitting diode display device of claim 1, wherein
    the first stack further includes a first hole injection layer and a first hole transport layer that are formed between the anode electrode and the blue emission layer, and a first electron transport layer formed between the blue emission layer and the CGL.

3. The organic light emitting diode display device of claim 2, wherein
    the second stack further includes
    a second hole injection layer and a second hole transport layer that are formed between the CGL and the fluorescent green emission layer,
    an exciton blocking layer (EBL) formed between the fluorescent green emission layer and the phosphorescent red emission layer, and
    an electron injection layer and a second electron transport layer that are formed between the phosphorescent red emission layer and the cathode electrode.

* * * * *